United States Patent
Takahashi

[19]
[11] Patent Number: 5,930,271
[45] Date of Patent: *Jul. 27, 1999

[54] CIRCUIT TESTING APPARATUS FOR TESTING CIRCUIT DEVICE INCLUDING FUNCTIONAL BLOCK

[75] Inventor: Kouji Takahashi, Gyoda, Japan

[73] Assignee: Advantest Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/737,522
[22] PCT Filed: Mar. 13, 1996
[86] PCT No.: PCT/JP96/00627
  § 371 Date: Nov. 12, 1996
  § 102(e) Date: Nov. 12, 1996
[87] PCT Pub. No.: WO96/28744
  PCT Pub. Date: Sep. 19, 1996

[30] Foreign Application Priority Data

Mar. 13, 1995 [JP] Japan ..................... 7-052432

[51] Int. Cl.⁶ .................................. G01R 31/28
[52] U.S. Cl. ............................... 371/27.1
[58] Field of Search ............... 371/27.1, 27.2, 371/27.3, 27.4, 27.5, 27.6, 27.7; 324/73.1

[56] References Cited

U.S. PATENT DOCUMENTS 4,775,977  10/1988  Dehara ........................ 371/27
5,072,178  12/1991  Matsumoto ..................... 324/158
5,390,192  2/1995   Fujieda ........................ 371/27.1

FOREIGN PATENT DOCUMENTS 39 02 835 A1  8/1990   Germany .
1-253665     10/1989   Japan .
2-38979       2/1990   Japan .
2-80984       3/1990   Japan .
3-12573       1/1991   Japan .
3-122578      5/1991   Japan .
4-168377      6/1992   Japan .

OTHER PUBLICATIONS

Siemens, AG; English Translation of DE39 02 835 A1, Aug. 2, 1990, Reference Previously Cited, in German with no Translation, in IDS filed Jun. 1, 1998.

Primary Examiner—Hoa T. Nguyen
Attorney, Agent, or Firm—Staas & Halsey

[57] ABSTRACT

A circuit testing apparatus is provided which is capable of, even if various additional circuits are connected to input and output of each of functional blocks to be tested of a circuit under test, testing each functional block independently using test pattern data originally prepared for testing the functional blocks. Between a pattern generator 11 and the circuit under test DUT is provided pattern converting means 20 which performs a pattern conversion of test pattern data fed to the circuit under test DUT from the pattern generator 11. The pattern conversion performed by the pattern converting means 20 has the relation reverse to that performed by the additional circuits connected to the input and output of each of the functional blocks to be tested.

8 Claims, 16 Drawing Sheets

F I G. 6

| ADDRESS | SQ₁ | | | | | | SQ₂ | | | | | |
|---|---|---|---|---|---|---|---|---|---|---|---|---|
| | SELECT | $S_3$ | $S_2$ | $S_1$ | $S_0$ | | SELECT | $S_3$ | $S_2$ | $S_1$ | $S_0$ | |
| 10 | D4 | 0 | 1 | 0 | 0 | | $\overline{D4}$ | 1 | 1 | 0 | 0 | |
| 11 | D3 | 0 | 0 | 1 | 1 | | $\overline{D3}$ | 1 | 0 | 1 | 1 | |
| 12 | D2 | 0 | 0 | 1 | 0 | | $\overline{D2}$ | 1 | 0 | 1 | 0 | |
| 13 | D1 | 0 | 0 | 0 | 1 | | $\overline{D1}$ | 1 | 0 | 0 | 1 | |

FIG. 7

SELECTOR TRUTH TABLE

| $S_3$ $S_2$ $S_1$ $S_0$ | OUTPUT |
|---|---|
| 0  0  0  0 | 0 |
| 0  0  0  1 | D1 |
| 0  0  1  0 | D2 |
| 0  0  1  1 | D3 |
| 0  1  0  0 | D4 |
| 0  1  0  1 | INDEFINITE:DISABLED |
| 0  1  1  0 | ↕ |
| 0  1  1  1 | INDEFINITE:DISABLED |
| 1  0  0  0 | 1 |
| 1  0  0  1 | D1 |
| 1  0  1  0 | D2 |
| 1  0  1  1 | D3 |
| 1  1  0  0 | D4 |
| 1  1  0  1 | INDEFINITE:DISABLED |
| 1  1  1  0 | ↕ |
| 1  1  1  1 | INDEFINITE:DISABLED |

5,930,271

CIRCUIT TESTING APPARATUS FOR TESTING CIRCUIT DEVICE INCLUDING FUNCTIONAL BLOCK

FIELD OF THE INVENTION

The present invention relates to a circuit testing apparatus for testing a circuit such as an IC (semiconductor integrated circuit) of the type having various functional blocks integrated therein or a circuit device of the type having various functional blocks mounted on a board or the like.

BACKGROUND OF THE RELATED ART

FIG. 15 illustrates a general construction of a prior typical circuit testing apparatus (circuit tester) of this kind. The circuit testing apparatus, denoted generally by reference numeral 10, comprises a pattern generator 11, a waveform generator 12 and a logical comparator 13. The waveform generator 12 generates a test pattern signal having a waveform necessary for testing a circuit under test DUT (or circuit to be tested), based on test pattern data included in pattern data which is outputted from the pattern generator 11. The test pattern signal generated by the waveform generator 12 is applied to a group of input terminals of the circuit under test DUT and the response outputs thereof are fed into the logical comparator 13. The logical comparator 13, which is supplied with expected value pattern data included in the pattern data from the pattern generator 11, performs a logical comparison between the expected value pattern data and the response outputs from the circuit under test DUT to sequentially detect whether there is an anti-coincidence between them, and when an anti-coincidence is detected by the logical comparator 13, a failure location of the circuit under test is specified or the like whereby the tested circuit is determined to be a "pass" (conforming circuit) or "failure" (non-conforming circuit).

Various kinds of pattern data including test pattern data, expected value pattern data and the like, which are outputted from the pattern generator 11 are prepared according to the function and scale of a circuit under test DUT, and/or the purpose of the test. Therefore, in case of testing a new kind of circuit device (IC or circuit device mounted on a board), pattern data (such as test pattern data, expected value pattern data, and the like) suitable for such new circuit device must be prepared. It is a general practice in the art to generate the pattern data by using a software, and as matters now stand, the development of the program therefor requires many hands and much time.

With an increase in the integration density of ICs, there is a tendency that an IC has functional blocks such as a memory, central processing means, a logic circuit, and the like integrated in the IC together with other integrated circuits. There are also cases where functional blocks such as a memory, central processing means, a logic circuit, and the like are mounted on a printed circuit board to form a circuit device. Since these functional blocks are interconnected in the IC or circuit board to operate, there is a disadvantage that the functional blocks cannot be tested individually or separately from the outside.

To enable independent testing of each functional block, there has been proposed such a scheme (or solution) that in addition to circuit wiring for actual operations of the functional blocks A, B, C and D, additional circuits RA, RB, RC and RD as well as additional circuits MA, MB, MC and MD are provided in correspondence with the functional blocks A, B, C and D, respectively, as shown in FIG. 16 and then test pattern data can be applied to each of the functional blocks through the additional circuits RA to RD and MA to MD and the corresponding response outputs can be taken out from the respective functional blocks, separately.

Now, this scheme will be described. The additional circuits MA to MD are storage parts that constitute a mode switching register. The outputs of the storage parts MA to MD forming the register are connected to respective mode switching terminals MOD of the corresponding functional blocks A to D as shown. In such construction, when it is desired to test only the functional block A, a serial data of "1, 0, 0, 0", for instance, is inputted to the register from an input terminal MT thereby storing a logic "1" in the additional circuit MA and a logic "0" in the remaining three additional circuits MB to MD. As a result, the storage output of the first-stage additional circuit MA, that is, the logic "1" is supplied to the mode switching terminal MOD of the corresponding functional block A, whereas the storage outputs of the second- to last-stage additional circuits MB to MD all of which are the logic "0" are supplied to the mode switching terminals MOD of the corresponding functional blocks B to D, respectively. Assuming, for example, that the logic "1" is an operation mode setting instruction for each functional block and the logic "0" an unoperation mode setting instruction, only the functional block A supplied with the logic "1" can be set in the operation mode and the remaining functional blocks B to D supplied with the logic "0" in the unoperation mode.

Next, resetting the additional circuits MA to MD and inputting a serial data of "0, 1, 0, 0" via the input terminal MT, only the functional block B is placed in the operation and the remaining functional blocks A, C and D in the unoperation mode. Thus, the functional blocks A to D can each be set in the operation mode independently of the others.

On the other hand, the additional circuits RA to RD constitute shift registers that have bits equal to the sums of the numbers of input and output terminals of the corresponding functional blocks A to D, respectively, and these shift registers are connected in cascade. With such construction, in the case of testing the functional block A, serialized test pattern signals to be fed to the functional block A are inputted through an input terminal PT and at a point in time when the test pattern signals have been shifted to the position where the test pattern signals can be given to all input terminals of the functional block A, the test pattern signals are inputted in parallel into the functional block A through its input terminals. The response outputs from the functional block A are read out in parallel to bit positions at the latter stage of the additional circuit (shift register) RA, and then the read-out response output signals are outputted in series and taken out from an output terminal QT via the remaining cascade-connected additional circuits RB to RD. Thus, the response outputs from the functional block A can be taken out. By converting the response outputs from the serial form into a parallel form, they can be compared with expected value pattern data in the logical comparator 13 provided in the circuit testing apparatus 10 to determine whether the functional block thus tested is a conforming ("pass") one or non-conforming ("failure") one.

As described above, a desired one of the functional blocks A to D can be tested independently by setting that one of the functional blocks A to D to the operation mode through the associated one of the additional circuits MA to MD, and thereafter supplying a serialized test pattern signals to the functional block set to the operation mode through the associated one off the additional circuits RA to RD, and taking out its response outputs in serial form via the output terminal QT, and converting the serial signal into a parallel signal.

FIG. 17 shows another example of the additional circuit. The illustrated example is used with a high-speed operating type functional block. The high-speed operating type functional block denoted by HSP may be a high-speed memory, for instance. To write data into and read it out of the high-speed memory, retiming circuits $TMI_1$ and $TMI_2$ are connected to the input and output sides of the memory, and the write and read of the memory are effected under the control of the retiming circuits $TMI_1$ and $TMI_2$, that is, by using an accurate timing produced by the retiming circuits $TMI_1$ and $TMI_2$.

In order to test the high-speed operating functional block HSP added with such additional circuits as the retiming circuits $TMI_1$ and $TMI_2$, it is necessary to give to the expected value pattern data a delay time produced by the additional circuits thereby matching the timing of the response output signal from the functional block with the timing of the expected value pattern data to provide them to the logical comparator 13.

As described above, in case the functional blocks to be tested are added with additional circuits, it is necessary in the circuit testing apparatus 10 that the pattern data to be generated from the pattern generator 11 are modified or altered corresponding to the differences between the various additional circuits. In particular, where test pattern data for application to each of the functional blocks A to D has already been developed, a program for generating the test pattern data needs to be developed again for each of the various additional circuits differing from one another, resulting in a serious economic loss.

DESCRIPTION OF THE PREFERRED EMBODIMENTS

An object of the present invention is to provide a circuit testing apparatus which permits testing of common functional blocks through the use of the same test pattern data regardless of the presence or absence of additional circuits.

According to the present invention, pattern converting means is provided between a Pattern generator and a circuit under test. The pattern converting means has a function for converting a pattern data from the pattern generator into one that corresponds to the function of each of various additional circuits in accordance with a preset. Further, the pattern converting means is provided with a plurality of function converting blocks corresponding to each of the additional circuits, and selector means for properly selecting and actuating required one or more of the plural function converting blocks in accordance with the additional circuit added to the circuit under test.

With the above construction, appropriate one or more of the plural function converting blocks provided in the pattern converting means can be selected according to the additional circuit added to the circuit under test and the pattern data can be converted into one in the form of being passable through the additional circuit by using the selected function converting block or blocks. On the other hand, in case of testing a functional block with no additional circuit, the pattern converting means does not select any one of the function converting blocks and permits the pattern data fed from the pattern generator to pass through the pattern converting means without converting it so that the test pattern data included in the pattern data can be inputted into the waveform generator as the proper test pattern data. Thus, according to the present invention, it is possible to test both of functional blocks with and without additional circuits using common test pattern data.

BRIEF DESCRIPTION OF THE DRAWINGS

FIG. 6 is a table for explaining the operation of the another specific embodiment of the function converting block shown in FIG. 3;

FIG. 7 is a table similar to FIG. 6;

BEST MODE FOR CARRYING OUT THE INVENTION

Figure 1:
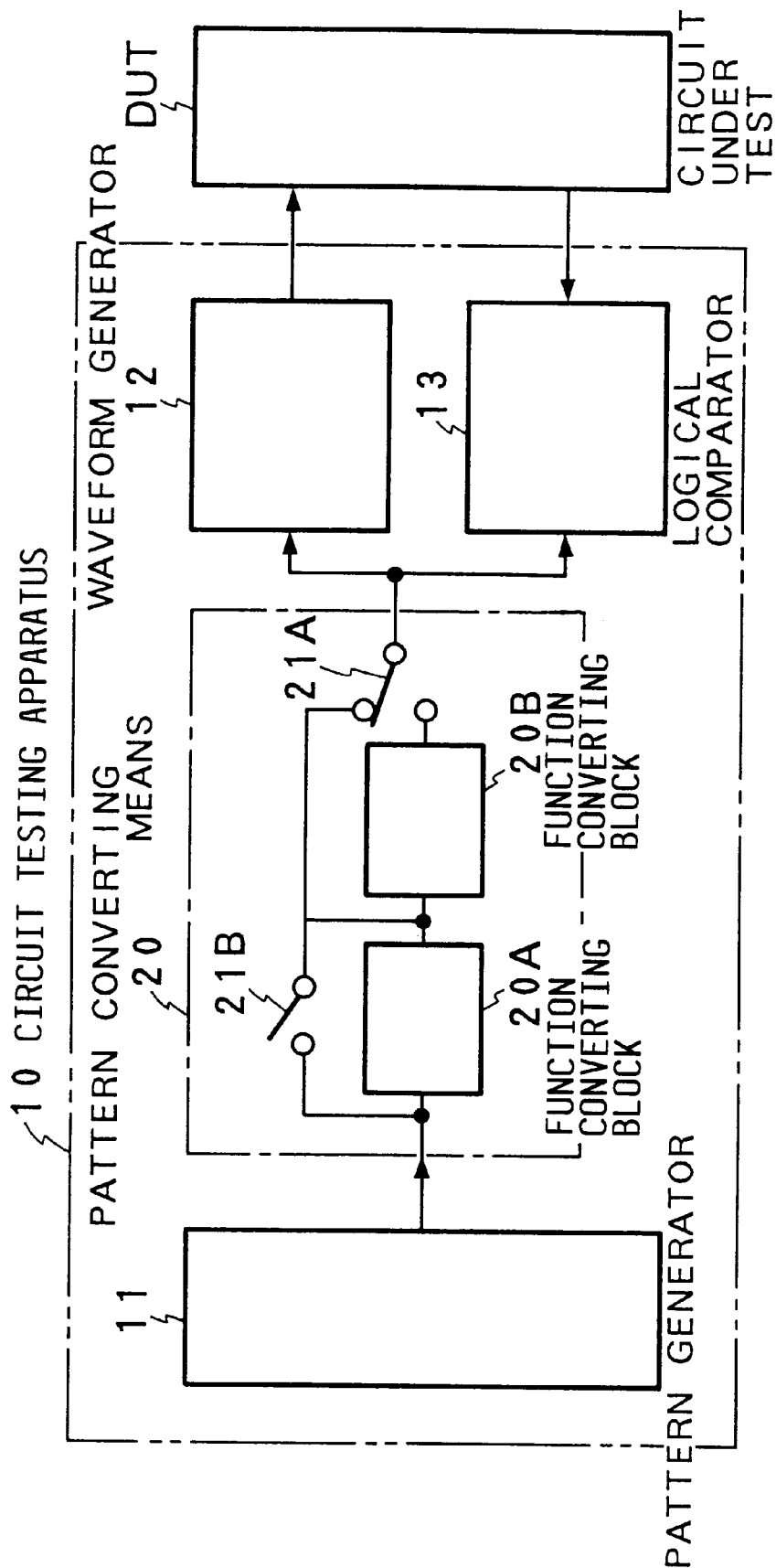
FIG. 1 is a block diagram showing the general concept of the circuit testing apparatus according to the present invention.
Figure 15:
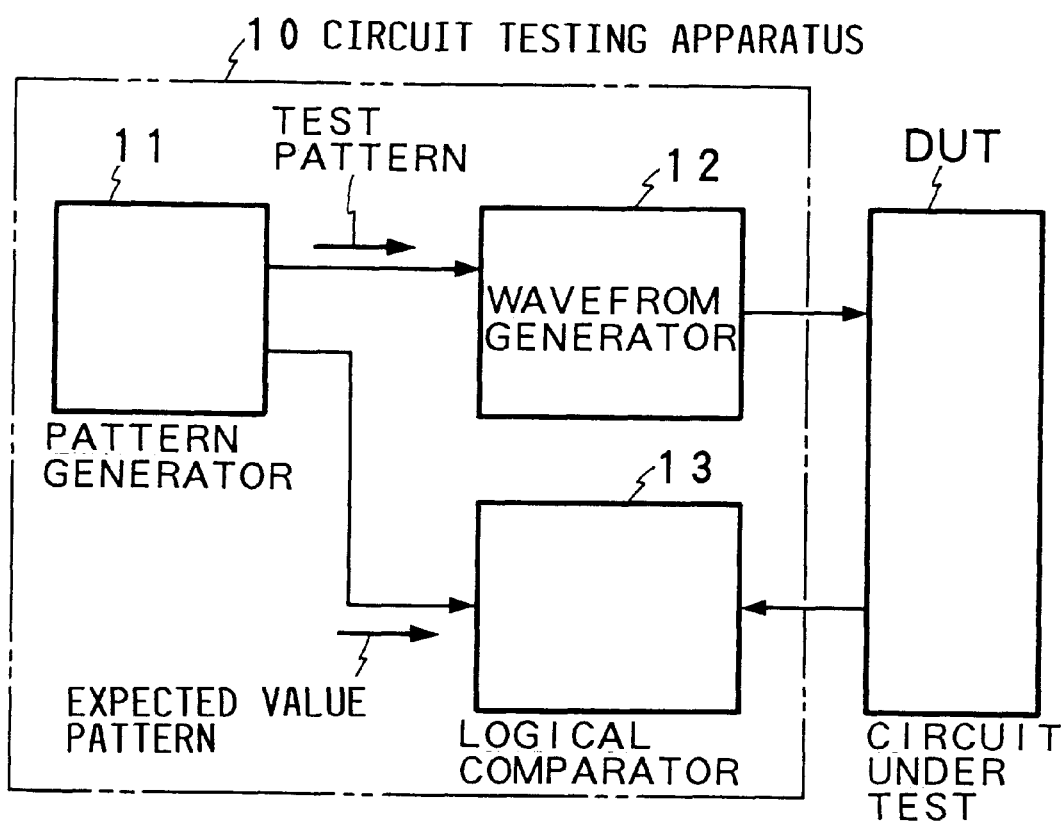
FIG. 15 is a block diagram for conceptually explaining an example of the prior circuit testing apparatus.
Figure 16:
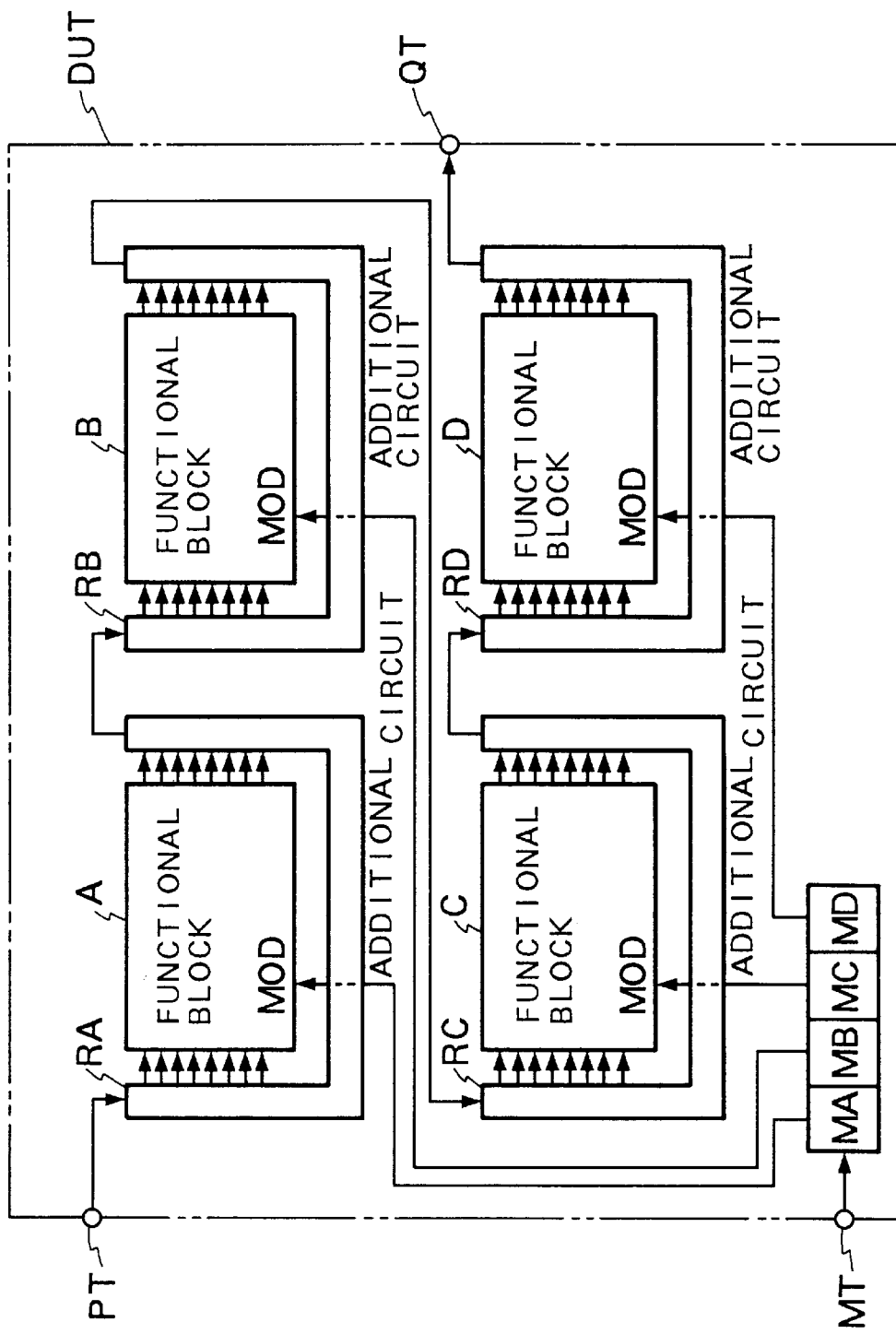
FIG. 16 is a block diagram for explaining a prior art example which can be tested for each of functional blocks.

FIG. 1 illustrates in block form the general concept of the circuit testing apparatus according to the present invention. To facilitate a better understanding of the present invention, the components or portions in FIG. 1 corresponding to those in the prior circuit testing apparatus described previously with reference to FIGS. 15 to 17 are denoted by the same reference numerals or characters. The circuit testing apparatus according to the present invention, denoted generally by reference numeral 10, also includes a pattern generator 11, a waveform generator 12, a logical comparator 13 and a circuit under test DUT as is the case with the prior art.

According to the present invention, pattern converting means 20 is provided between the pattern generator 11 and the circuit under test DUT (or circuit to be tested). The pattern converting means 20 comprises a plurality of (two in this example) function converting blocks 20A and 20B, and selector means 21A and 21B for selecting whether to connect or not the function converting blocks 20A and 20B to the circuit, respectively.

Since in the illustrated example there are provided two function converting blocks and correspondingly two selector means, the illustrated pattern converting means is so arranged that it can switch between following four modes (1) to (4) depending upon the switched states of the two selector means 21A and 21B, i.e., (1) a state in which neither of the function converting blocks is used (also called a through state), (2) a state in which only the converting function of the function converting block 20A in the preceding stage is used, (3) a state in which only the converting function of the function converting block 20B in the subsequent stage is used, and (4) a state in which both of the converting functions of the function converting blocks 20A and 20B are used.

Let it be assumed, for instance, that the function converting block 20A in the preceding stage is one which has a converting function being capable of delaying by a given time interval data of given one or more bits of the pattern data, and the function converting block 20B is in the subsequent stage is one which has a function of converting pattern data in parallel form into a serial form.

That is to say, the pattern conversion performed by these function converting blocks 20A and 20B has the pattern relation inverse to the pattern conversion produced by the additional circuits added to the circuit under test DUT. For example, the additional circuits RA to RD added to the circuit under test shown in FIG. 16 convert a serial test pattern signal to parallel test pattern signals, and hence the function converting block 20B corresponding to the additional circuits RA to RD carries out a pattern conversion in which parallel signals are converted into a serial form, which is inverse to the pattern conversion performed by the additional circuits RA to RD. For another example, the additional circuits $TMI_1$ and $TMI_2$ added to the circuit under test shown in FIG. 17 carry out the pattern conversion of delaying the test pattern signal applied to the functional block HSP by the retiming operation, and hence the function converting block 20A corresponding thereto performs a pattern conversion of giving to the expected value pattern signal the same delay time as that given by the additional circuits (the retiming circuits), which is inverse to the pattern conversion performed by the additional circuits $TMI_1$ and $TMI_2$.

Figure 2:
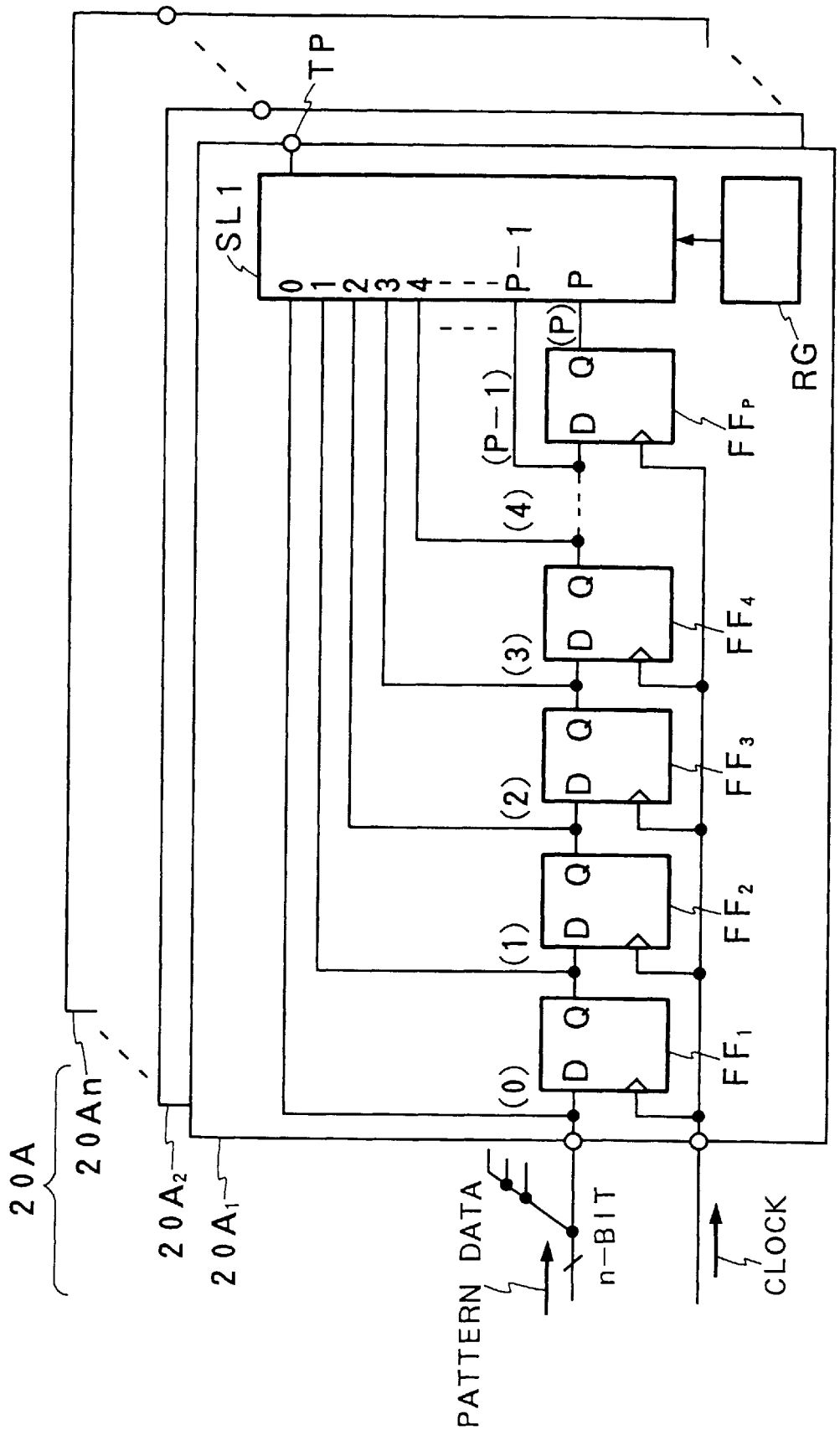
FIG. 2 is a schematic diagram showing an specific embodiment of the function converting block of the pattern converting means used in a first embodiment of the circuit testing apparatus according to the present invention.

Next, a description will be given of a specific embodiment of the pattern converting means used in a first embodiment of the circuit testing apparatus according to the present invention. FIG. 2 illustrates a specific embodiment of the function converting block 20A of the pattern converting means 20. As shown in FIG. 2, the function converting block 20A comprises function converting blocks $20A_1$ to $20A_n$ of the number corresponding to the number (for example, n) of bits of the pattern data outputted from the pattern generator 11 (FIG. 1). Since each of the function converting blocks $20A_1$ to $20A_n$ has the same construction, there is shown in FIG. 2, as a typical example, the construction of only the function converting block $20A_1$ corresponding to the first bit of the pattern data. The function converting block $20A_1$ includes a flip-flop array constituted by a plurality of cascade-connected flip-flops $FF_1$ to $FF_P$ and a selector SL1 for selectively taking out the delayed outputs from the flip-flops $FF_1$ to $FF_P$ of the flip-flop array, and the flip-flop array and the selector SL1 form a variable delay circuit. Connected to the selector SL1 is a setting register RG in which data is set, and according to the value of the data set in the register RG, a signal at any one of output terminals 1 to P of the flip-flops is taken out to an output terminal TP of the selector SL1.

Figure 17:
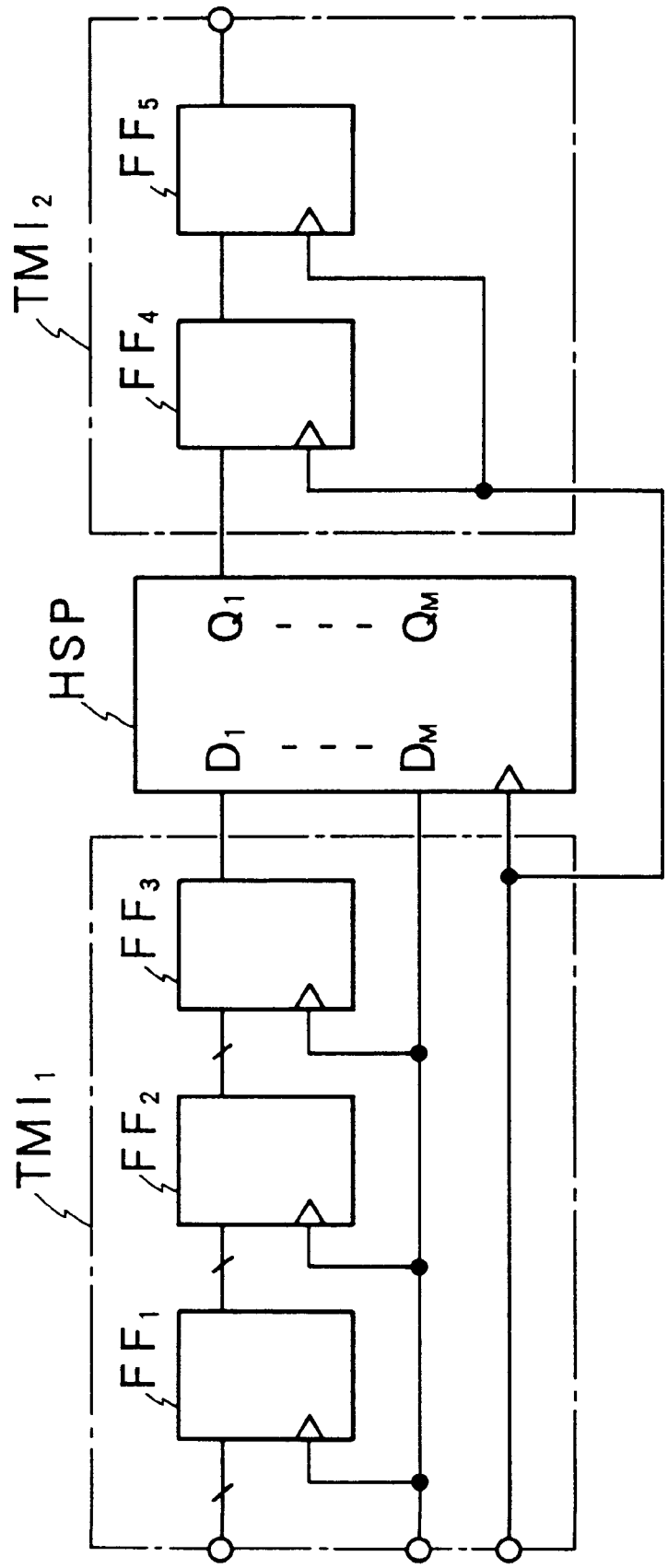
FIG. 17 is a block diagram for explaining another prior art example which can be tested for each of functional blocks.

Accordingly, by setting the delay time in each of the flip-flops $FF_1$ to $FF_P$ to a desired time, data of given one or more bits in the n-bit pattern data can be delayed by the desired time interval (within the range of the number P of stages of the flip-flop array). For instance, by setting the delay time in each of the flip-flops $FF_1$ to $FF_P$ to the same value as that of the delay time produced by the additional circuit or circuits added to the circuit under test DUT, data of one or more bits corresponding to the expected value pattern data in the n-bit pattern data can be delayed by the same time interval as that produced by the additional circuit or circuits followed by the application of the data to the logical comparator 13 so that even the functional block HSP with the retiming circuits $TMI_1$ and $TMI_2$ connected to its write and readout sides, as shown in FIG. 17, can also be tested using ordinary test pattern data. Further, in the illustrated embodiment, the first-stage flip-flop $FF_1$ also has its input terminal 0 connected to the selector SL1, and hence, it is arranged such that any bit of the data inputted into the function converting block $20A_1$ can be taken out at the output terminal TP of the selector SL1 without delay.

Figure 3:
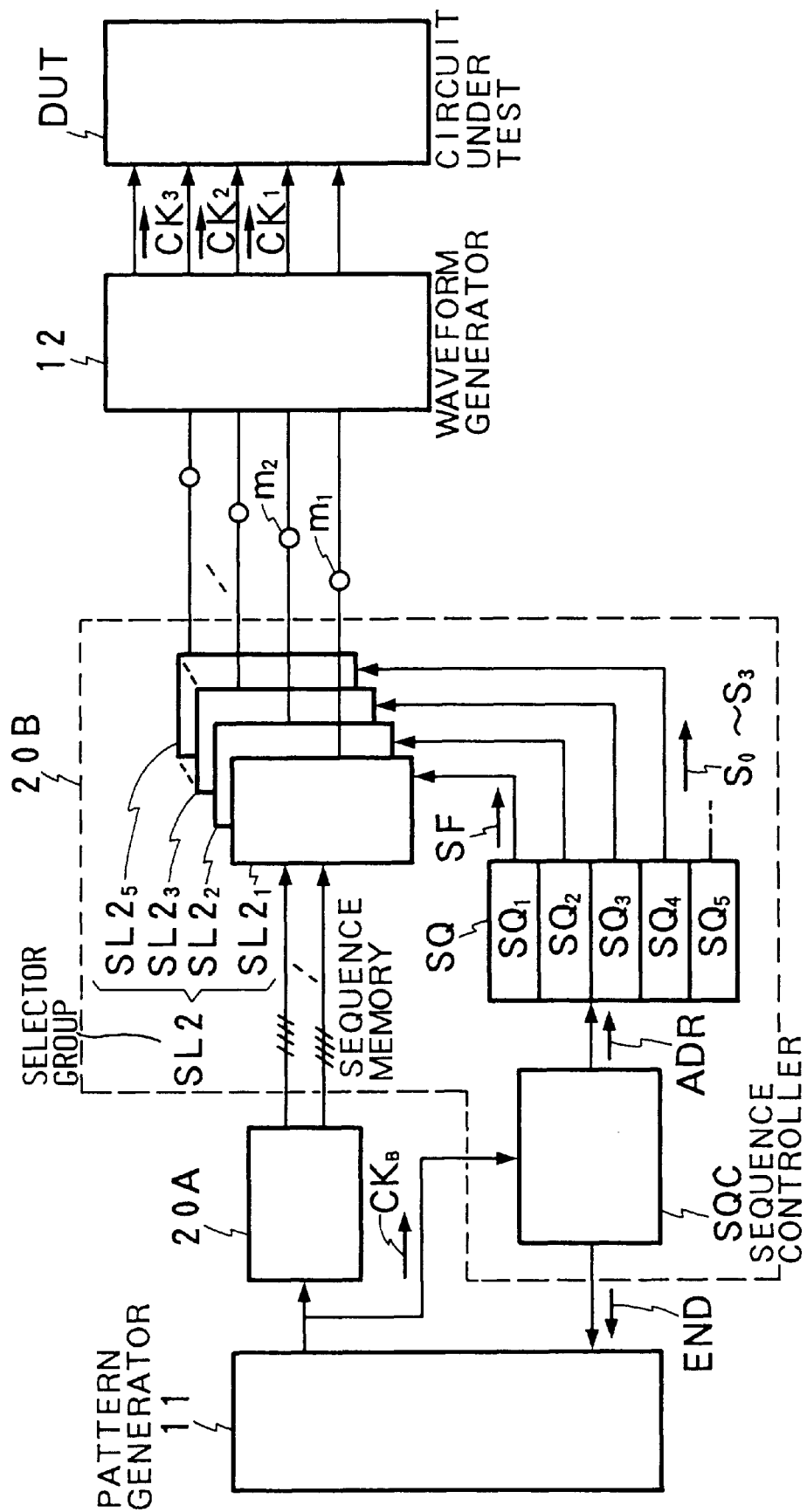
FIG. 3 is a schematic diagram showing another specific embodiment of the function converting block of the pattern converting means used in the first embodiment of the circuit testing apparatus according to the present invention.

FIG. 3 illustrates a specific embodiment of the function converting block 20B. The function converting block 20B functions to convert pattern data of n bits in parallel form into pattern data in serial form. For this end, the function converting block 20B can be constituted by a selector group SL2 including selectors $SL2_1$, $SL2_2$ each of which converts an input of n bits into a serial signal of one bit string, and other selectors $SL2_3$ to $SL2_5$ which have functions described later on, a sequence memory SQ which generates a control signal SF for controlling the operation of the selector group SL2, and a sequence controller SQC which applies an address signal ADR to the sequence memory SQ to output therefrom a control signal corresponding to the address signal ADR.

For the sake of simplicity, a description will be given of testing a functional block under test which is a four-terminal input, four-terminal output type functional block A (having four input terminals and four output terminals) shown in FIG. 4. The functional block A forms a part of the circuit under test DUT mounted on an IC or wiring board, for instance, and in practice, input terminals $D_1$ to $D_4$ and output terminals $Q_1$ to $Q_4$ shown in FIG. 4 are connected to other functional blocks (not shown in FIG. 4) and the like in the circuit under test DUT so that this functional block A actually operates as a four-terminal input, four-terminal output type functional block.

Reference character RA denotes an additional circuit added to test the functional block A independently in the circuit under test DUT. In this case the additional circuit RA is formed as a shift register in which four flip-flops $FF_{11}$ to $FF_{14}$ at the input side of the functional block A and four flip-flops $FF_{21}$ to $FF_{24}$ at the output side thereof are connected in cascade by a line LL.

The flip-flops $FF_{11}$ to $FF_{14}$ at the input side form shift register stages for inputting a serial data fed to the input terminal PT of the additional circuit RA to the input terminals $D_1$ to $D_4$ of the functional block A as parallel data. On the other hand, the flip-flops $FF_{21}$ to $FF_{24}$ at the output side form shift register stages for reading out response outputs of the functional block A which are provided at the output terminals $Q_1$ to $Q_4$ of the functional block A and outputting them as a serial data to the output terminal QT. Since the shift register stages at the input side and the shift register stages at the output side are connected in cascade by the line LL as mentioned above, in the case of testing a functional block other than the functional block A, the inputted serial test pattern signal can be fed as it stands to the additional circuit added to that functional block under test.

Figure 4:
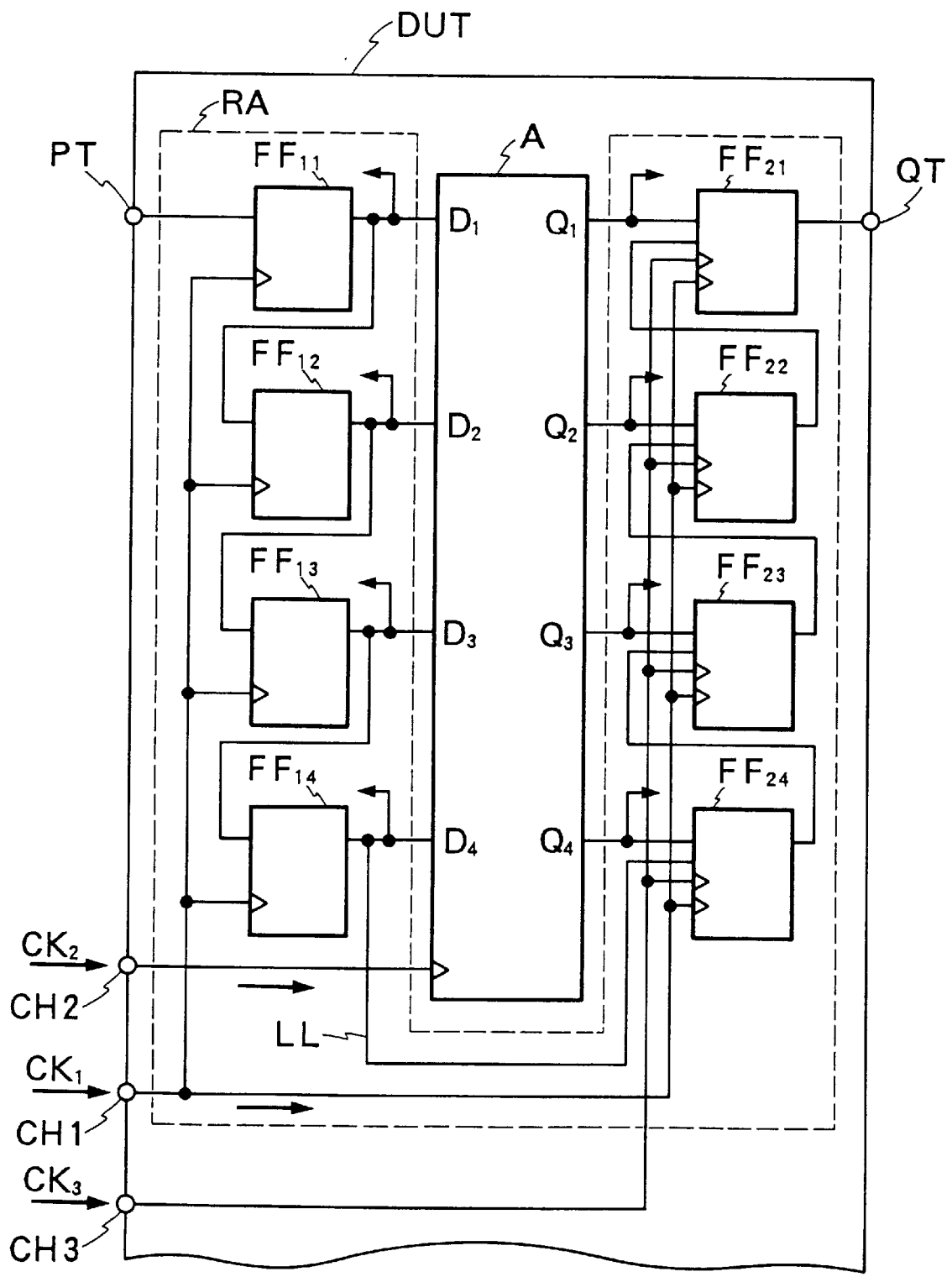
FIG. 4 is a schematic diagram illustrating an example of a circuit under test having an additional circuit which performs a converting operation inverse to that of the pattern converting means shown in FIG. 3.

In FIG. 4, reference character CH1 denotes a clock input terminal for applying therethrough a drive clock $CK_1$ to the shift registers formed by the flip-flops $FF_{11}$ to $FF_{14}$ and $FF_{21}$ to $FF_{24}$, and CH2 denotes a clock input terminal for applying therethrough an operating clock $CK_2$ to the functional block A. The flip-flops FF21 to FF24 connected to the output side of the functional block A are each shown to have two data read terminals (input terminals) and two clock input terminals. That is, a clock input terminal CH3 is provided and a clock $CK_3$ inputted into the clock terminal CH3 is used to store the outputs from the functional block A under test in the flip-flops $FF_{21}$ to $FF_{24}$. At the same time, the data stored by use of the clock $CK_3$ is shifted by the clock $CK_1$ to output as a serial data from the output terminal QT. This embodiment is adapted so that a positive phase signal can be applied to the input terminal PT connected to the additional circuit RA.

Figure 5:
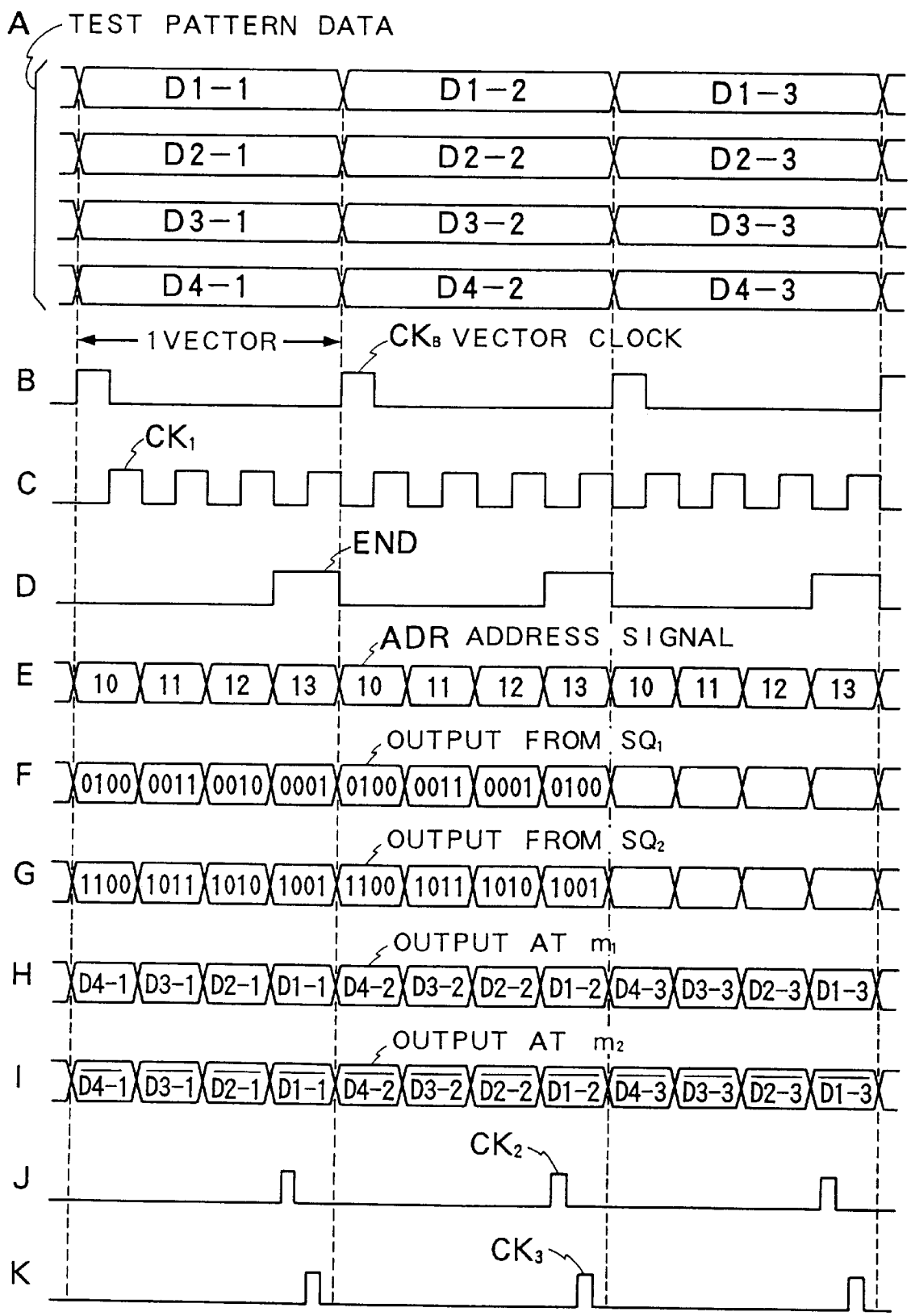
FIG. 5 is a timing chart for explaining the operation of the another specific embodiment of the function converting block shown in FIG. 3.

The test pattern data for testing the functional block A without the additional circuit RA is generated from the pattern generator 11 in the form of parallel data of four bits D1-1, D2-1, D3-1 and D4-1 for each vector as shown in FIG. 5A. In addition to the test pattern data D1-1, D2-1, D3-1, D4-1, . . . , is generated from the pattern generator 11 a vector clock $CK_B$ indicating that the test pattern data has been outputted as shown in FIG. 5B.

The vector clock $CK_B$ is applied to the sequence controller SQC shown in FIG. 3. Upon receiving the vector clock CKB, the sequence controller SQC generates an address signal ADR (FIG. 5E) of a rate corresponding to the bit width of the test pattern data. That is, in this example, the address signal ADR of a rate quadruple to that of the test pattern data is generated and fed to the sequence memory SQ. There are stored in the sequence controller SQC a starting and an ending addresses for reading the sequence memory SQ, and each time the address signal generated reaches the read ending address, the address signal is returned to the read starting address, and at the same time, a test pattern data request signal END (FIG. 5D) is sent to the pattern generator 11 to output therefrom the next test pattern data. Consequently, upon receiving the signal END, the pattern generator 11 outputs the test pattern data D1-2, D2-2, D3-2 and D4-2 of the next vector.

In this example, the address signal ADR, which is outputted from the sequence controller SQC, is assumed to have four addresses 10, 11, 12 and 13 as depicted in FIG. 5E. The selector $SL2_1$ among the selector group SL2 is assumed to be one which converts parallel data into a serial data, the selector $SL2_2$ is assumed to be one which obtains a serial data opposite in phase to the serial data converted by the selector $SL2_1$, and the selectors $SL2_3$ to $SL2_5$ are assumed to be ones which output patterns whereby the waveform generator 12 generates the clocks $CK_1$, $CK_2$ and $CK_3$ which are needed in the circuit under test DUT, respectively.

The selectors $SL2_1$ to $SL2_5$ are controlled by control signals that are read out of the sequence memory SQ. To this end, the sequence memory SQ is provided with five storage areas $SQ_1$ to $SQ_5$ in this example from which are read out the control signals for application to the selectors $SL2_1$ to $SL2_5$, respectively.

In FIG. 6 there are shown the contents of data set in the storage areas $SQ_1$ and $SQ_2$ of the sequence memory SQ. In this example, "0100" is stored in the first address "10" of the storage area $SQ_1$ as shown. This data is a control signal for causing the selector $SL2_1$ to operate to select the pattern data $D_4$ of the fourth bit in the test pattern data as shown in the truth table of the selector group SL2 in FIG. 7. Also, "0011" is written in the second address "11" of the storage area $SQ_1$. This data "0011" is a control signal for causing the selector $SL2_1$ to operate to select the pattern data $D_3$ of the third bit in the test pattern data as shown in the truth table of FIG. 7. In the third address "12" of the storage area $SQ_1$ data "0010" is written. This data "0010" is a control signal for causing the selector $SL2_1$ to operate to select the pattern data $D_2$ of the second bit in the test pattern data as shown in the truth table of FIG. 7. In the fourth address "13" of the storage area $SQ_1$ data "0001" is written. This data "0001" is a control signal for causing the selector $SL2_1$ to operate to select the pattern data of the first bit in the test pattern data as shown in the truth table of FIG. 7.

Accordingly, by the sequential application of the address signal ADR from the sequence controller SQC to the addresses "10, 11, 12, 13" of the storage area $SQ_1$ of the sequence memory SQ in order, the control signals SF (FIG. 5F) "0100", "0011", "0010" and "0001" are sequentially read out from the storage area $SQ_1$ of the sequence memory SQ, that is, read out in serial as depicted in FIG. 5F. These control signals SF are sequentially applied to the selector $SL2_1$ which in turn selects the test pattern data D4-1 of the fourth bit, D3-1 of the third bit, D2-1 of the second bit and Dl-1 of the first bit in the test pattern data in this order as shown in FIG. 5H, and sequentially outputs these test pattern data D4-1, D3-1, D2-1 and Dl-1 via an output terminal $m_1$.

When the sequence controller SQC outputs the test pattern data request signal END (FIG. 5D) at the time point of having selected the pat-tern data Dl-1 at the ending address "13", the pattern generator 11 outputs the test pattern data D1-2, D2-2, D3-2 and D4-2 of the next vector. Since in this state the address signal ADR from the sequence controller SQC is applied again to the addresses in the order of "10, 11, 12, 13", the control signals SF are read out of the storage areas $SQ_1$, of the sequence memory SQ in the order of "0100, 0011, 0010, 0001". Consequently, the selector $SL2_1$ again selects the test pattern data in the order of "D4-2, D3-2, D2-2, D1-2" and serially outputs them via the output terminal $m_1$.

The test pattern data D4-1, D3-1, D2-1, D1-1 and D4-2, D3-2, D2-2, D1-2 outputted from the output terminal $m_1$ are serially inputted into the waveform generator 12 wherein they are converted into real waveforms (waveforms necessary for testing) in accordance with the logical values of the test pattern data, and the converted waveforms are fed to the input terminal PT of the circuit under test DUT.

To the clock input terminal CH1 of the circuit under test DUT is applied the clock $CK_1$ shown in FIG. 5C which is synchronized with the address signal ADR. Since the clock $CK_1$ is used to drive the flip-flops $FF_{11}$ to $FF_{14}$, each time the test pattern data D4-1, D3-1, D2-1, D1-1, D4-2, D3-2, D2-2 and D1-2 selected by the selector $SL2_1$ are sequentially outputted therefrom one by one, they are sequentially fed to and stored in the flip-flops $FF_{11}$, $FF_{12}$, $FF_{13}$ and $FF_{14}$ while being shifted therethrough one by one.

At a point in time when the test pattern data D4-1, D3-1, D2-1 and D1-1 are stored in the flip-flops $FF_{14}$ to $FF_{11}$, the waveform generator 12 outputs the clock $CK_2$ shown in FIG. 5J which is given to the clock input terminal CH2 of the circuit under test DUT shown in FIG. 4. With the clock $CK_2$ supplied, the functional block A of the circuit under test DUT takes therein the test pattern data stored in the flip-flops $FF_{11}$ to $FF_{14}$. Also, the waveform generator 12 outputs the clock $CK_3$ depicted in FIG. 5K. The clock $CK_3$ is fed to the clock input terminal CH3 of the circuit under test DUT shown in FIG. 4. Upon input of the clock $CK_3$, the flip-flops $FF_{21}$ to $FF_{24}$ at the output side of the functional block A take therein the states (response outputs) at the output terminals $Q_1$ to $Q_4$ of the functional blocks A. By the application of the clock $CK_1$ to the clock input terminal CH1 after the flip-flops $FF_21$ to $FF_{24}$ have taken therein the states of the output terminals of the functional block A, all of the flip-flops $FF_{11}$ to $FF_{14}$ and $FF_{21}$ to $FF_{24}$ are driven so that the test pattern data D4-2, D3-2, D2-2 and D1-2 of the next vector are stored in the flip-flops $FF_{11}$ to $FF_{14}$ at the input side, and the response outputs of the functional block A stored in the flip-flops $FF_{21}$ to $FF_{24}$ at the output side are taken out to the outside through the output terminal QT. The serial signal taken out through the output terminal QT is converted by serial-parallel converting means not shown into parallel signals which are applied to the logical comparator 13 for logical comparison with expected values.

Further, FIG. 4 shows the case of inputting logical waveform data of the positive phase (positive logic) into the circuit under test DUT, but there can be also a circuit under test of a circuit structure which requires logical waveform data of the opposite phase (negative logic) to be inputted. In order to cope with this, the illustrated specific embodiment is arranged to have a construction in which the selector $SL2_2$ is provided in the selector group SL2 and is driven to generate logical waveform data of the opposite phase for application thereof to the input terminal PT of the circuit under test DUT.

Figure 8:
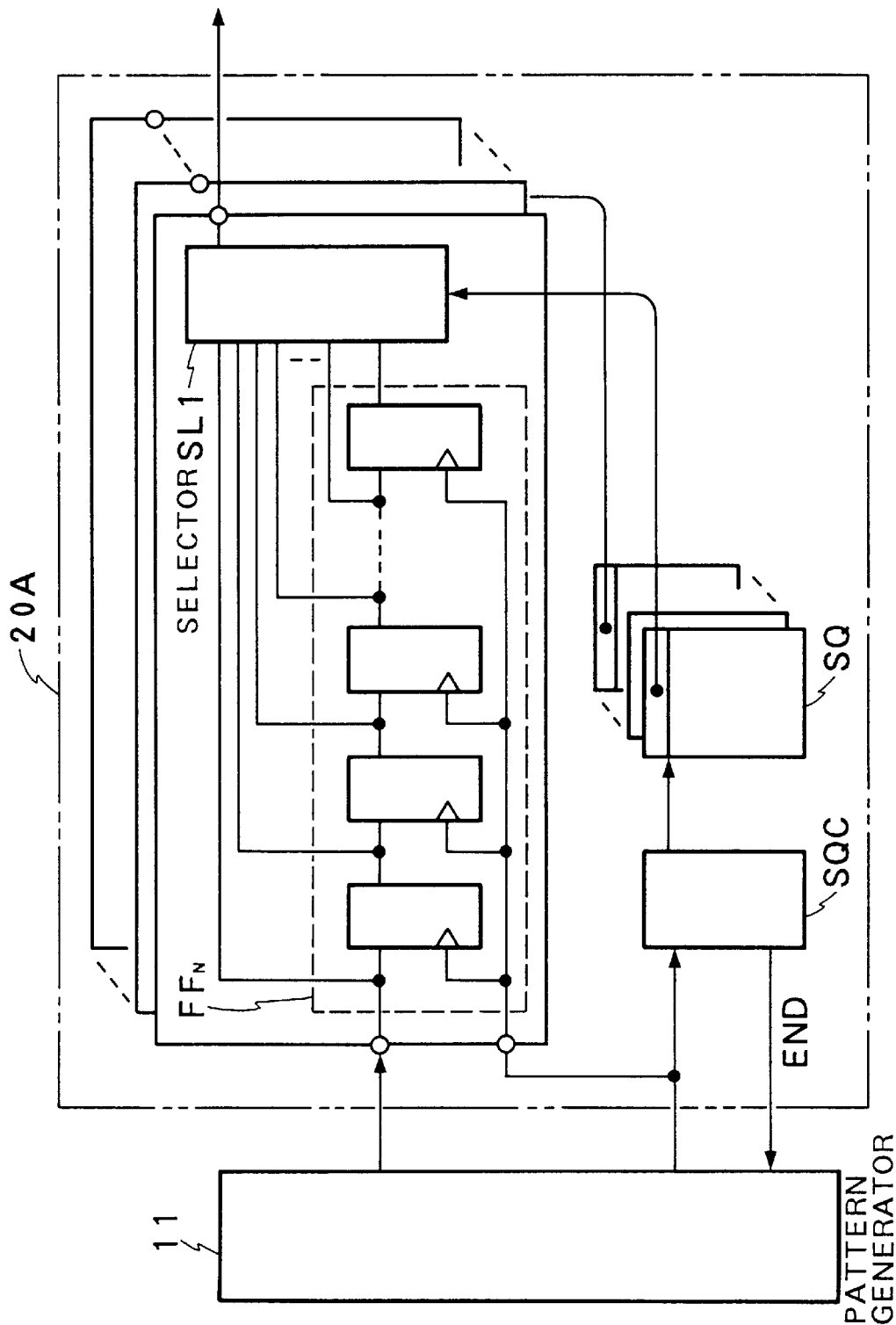
FIG. 8 is a schematic diagram showing an specific embodiment of the function converting block of the pattern converting means used in a second embodiment of the circuit testing apparatus according to the present invention.

FIG. 8 illustrates a specific embodiment of the function converting block 20A of the pattern converting means 20 used in a second embodiment of the circuit testing apparatus according to the present invention. As is the case with the FIG. 2 embodiment, the function converting block 20A includes function converting blocks of the number corresponding to that of bits of the pattern data outputted from the pattern generator 11, and each function converting block comprises a flip-flop array $FF_N$ composed of a plurality of cascade-connected flip-flops and a selector SL1 for selectively taking out delayed outputs of the flip-flops in the flip-flop array. In this embodiment, each function converting block further comprises a sequence memory SQ and the sequence memories SQ of the respective function converting blocks are placed under the control of one common sequence controller SQC. Since the operations of the function converting blocks and the selector SL1 have already been described in the above, their description will not be repeated unless required.

Upon each generation of pattern data, the sequence controller SQC is caused to generate an address signal which is applied to the sequence memory SQ. in the sequence memory SQ are stored delay data at respective addresses thereof, and the delay data stored in the address of the sequence memory SQ to which an address signal is applied is read out therefrom and fed to the selector SL1. The delay data is used to selectively take out data having different amounts of delays produced in the flip-flop array $FF_N$. Accordingly, this embodiment is adapted so that the amount of delay can be changed upon each generation of the pattern data.

Figure 9:
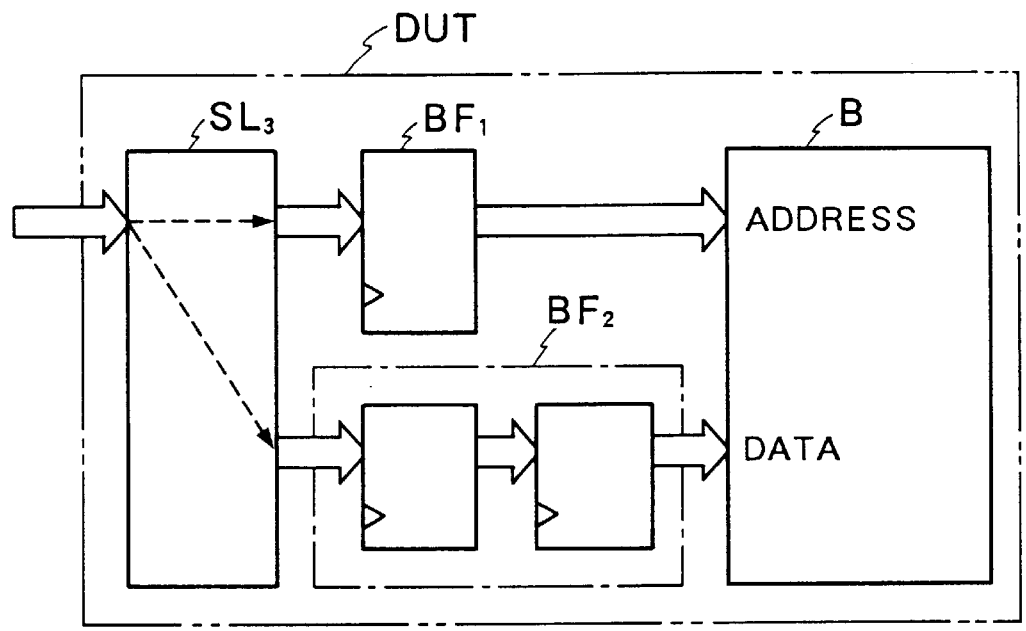
FIG. 9 is a block diagram showing an example of the circuit under test which can be tested using test pattern data converted in pattern by the function converting block shown in FIG. 8.
Figure 10:
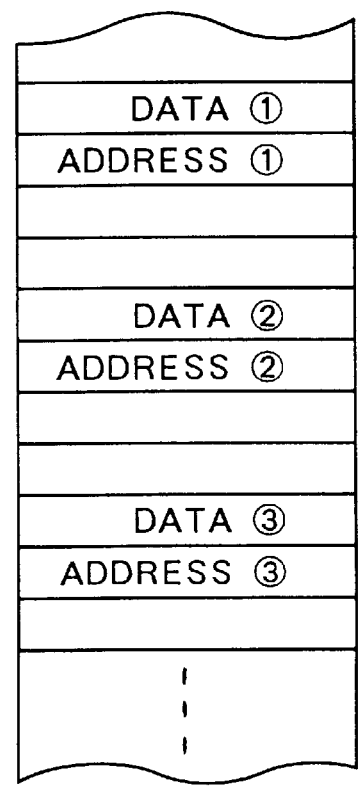
FIG. 10 is an illustration for explaining the operation of the circuit under test shown in FIG. 9.

FIG. 9 illustrates an example of the circuit under test DUT that can be tested using test pattern data converted in pattern by the function converting block 20A shown in FIG. 8. This circuit under test DUT is a multi-pin type integrated circuit. The multi-pin type integrated circuit is constructed to input and output, for example, an address signal and data using one or more common pins so as to minimize the number of pins led out to the outside for external connection. To this end, a selector SL3 and buffers $BF_1$ and $BF_2$ are provided in the integrated circuit. The buffers $BF_1$ and $BF_2$ are provided to input the address signal and data separated by the selector SL3 into a functional block B at the same timing. In the illustrated example, the two-stage buffer $BF_2$ is provided at the data side. Accordingly, in this case, inherently, a signal arranged such that the sequence of data followed by the address signal is repeated as shown in FIG. 10 is inputted to the functional block for operation thereof.

Figure 11:
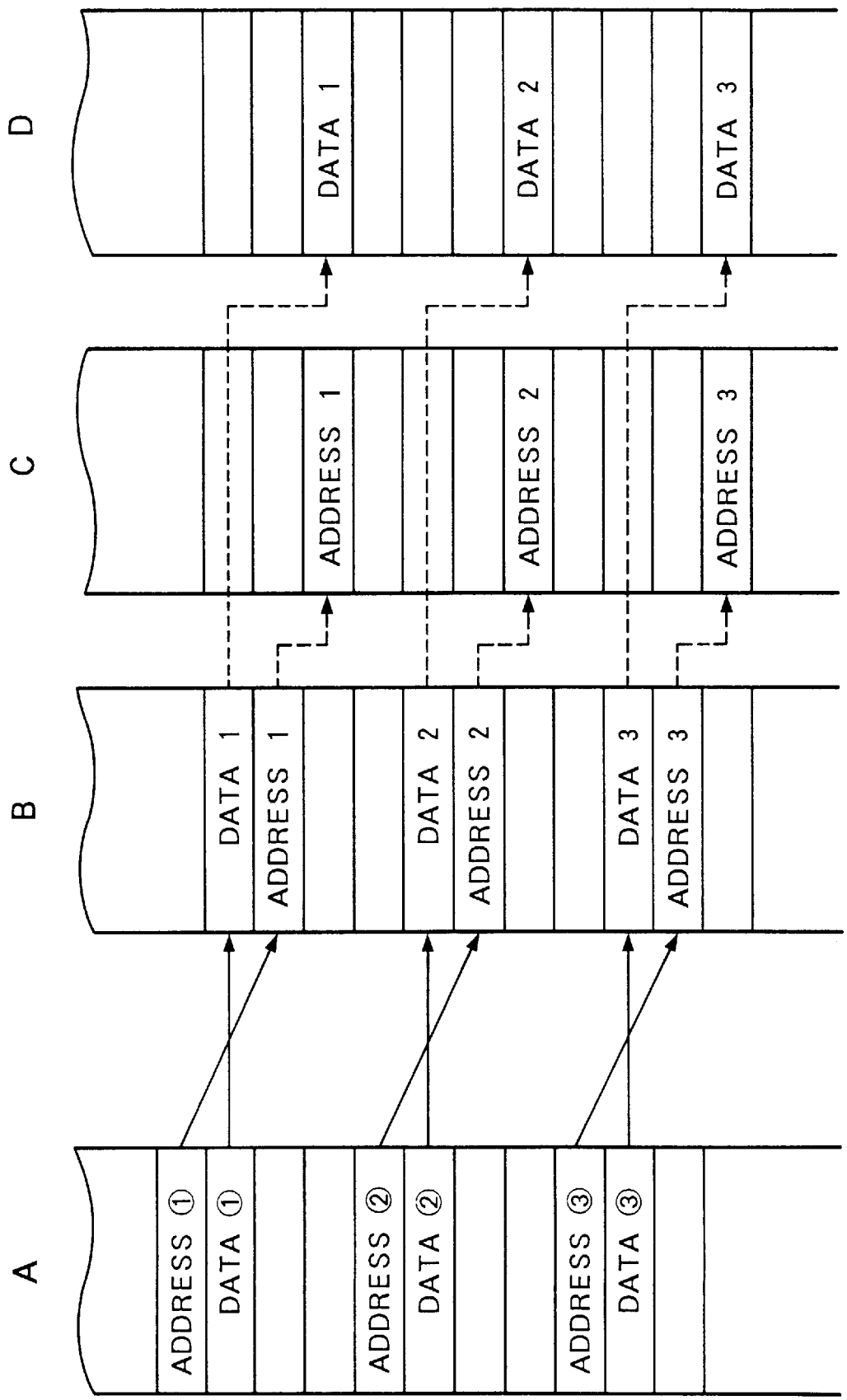
FIG. 11 is an illustration for explaining the operation of the function converting block shown in FIG. 8.

On the other hand, in case it is a standard type construction in the multi-pin type integrated circuit of this kind to have the two-stage buffer at the address signal side and the one-stage buffer at the data side in contrast with the construction shown in FIG. 9, it is common practice to prepare such pattern data arranged such that the sequence of the address signal followed by data is repeated as shown in FIG. 11A. In case of intending to test the circuit under test DUT shown in FIG. 9 using the test pattern data depicted in FIG. 11A, it is required to convert the test pattern data to a pattern arranged such that the sequence of data followed by the address signal is repeated as shown in FIG. 11B.

In such case, by delaying the address signal by a period of time corresponding to the delay time produced by the two-stage buffer using the function converting block 20A shown in FIG. 8, the test pattern data can be converted to the pattern arranged such that the sequence of data followed by the address signal is repeated as depicted in FIG. 11B. Hence, by providing the thus converted test pattern data (FIG. 11B) to the circuit under test DUT shown in FIG. 9, the address signal is delayed in the buffer $BF_1$ by the amount corresponding to the one stage and the data is delayed in the buffer $BF_2$ by the amount corresponding to the two stages, and consequently, the address signal and the data can be inputted into the functional block B at the same timing as shown in FIGS. 11C and 11D.

Figure 12:
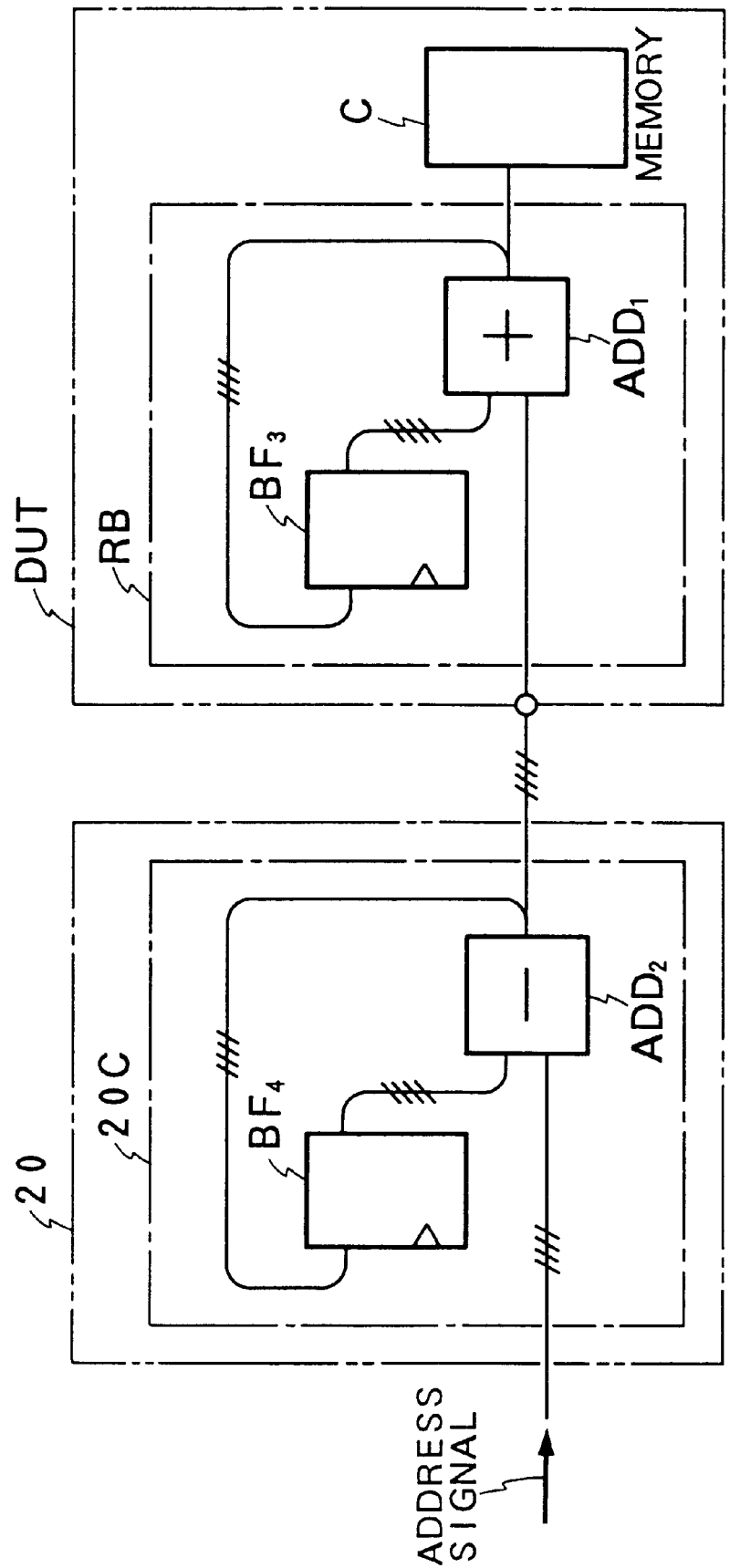
FIG. 12 is a schematic diagram showing the pattern converting means used in a third embodiment of the circuit testing apparatus according to the present invention.

FIG. 12 illustrates a specific embodiment of the pattern converting means 20 used in a third embodiment of the circuit testing apparatus according to the present invention, together with the circuit under test DUT. In this embodiment, a specific example of a function converting block will be described which can be used in case the circuit under test CUT has an address processing or treating function. For brevity of explanation, the constructions of the pattern generator, the waveform generator, etc. are not shown in FIG. 12.

There is a memory of the type which is accessed by a result of addition wherein input addresses are successively added. In this type of memory, there is provided an additional circuit RB having an address processing function which comprises an adder $ADD_1$ and a feedback buffer $BF_3$ in an address signal path to a functional block C forming the memory. The additional circuit RB successively adds input address signals and provides the result of addition to the functional block C. The circuit under test DUT with such additional circuit RB cannot be tested by applying normal address signals arranged in order of address for testing the circuit under test with the additional circuit RB in order of address. As a solution to this problem, according to the present invention, a function converting block 20C that has an arithmetic or operating function is provided in the pattern converting means 20.

The function converting block 20C can be constituted in this example by a subtractor $ADD_2$ and a feedback buffer $BF_4$. Address signals $A_1, A_2, A_3, \ldots, A_n$ arranged in order of address are fed to one input terminal of the subtractor $ADD_2$. Address signals $A_1, A_2, A_3, \ldots, A_n$ delayed by an amount of time corresponding to one clock by the feedback buffer $BF_4$ relative to the above-mentioned address signals $A_1, A_2, A_3, \ldots, A_n$, are fed to the other input terminal of the subtractor $ADD_2$ to subtract the latter from the former Letting the subtracted results be represented by $a_1, a_2, a_3, \ldots, a_n$, they are as follows:

$$a_1 = A_1 - 0$$
$$a_2 = A_2 - a_1 = A_2 - A_1$$
$$a_3 = A_3 - a_2 = A_3 - A_2 - A_1$$
$$\vdots$$
$$a_n = A_n - a_{n-1}$$

By the application of such processed address signals $a_1, a_2, a_3, \ldots, a_n$ to the circuit under test DUT, the additional circuit RB provided in the DUT performs the following calculations and provides the address signals $A_1, A_2, A_3, \ldots, A_n$:

$$a_1 + 0 = A_1$$
$$a_2 + A_1 = A_2 - A_1 + A_1 = A_2$$
$$a_3 + A_2 = A_3 - A_2 - A_1 + A_2 + A_1 = A_3$$
$$\vdots \qquad \vdots$$
$$a_n + A_{n-1} = A_n - \cdots - A_1 + A_{n-1} + \cdots + A_1 = A_n$$

and thus, the address signals arranged in order of address can be applied to the functional block C.

From the above, various examples of the circuit under test DUT, and various examples of pattern converting means 20 which are used to independently provide test pattern data to individual functional blocks of each of various kinds of circuits under test DUT will be understood.

Figure 13:
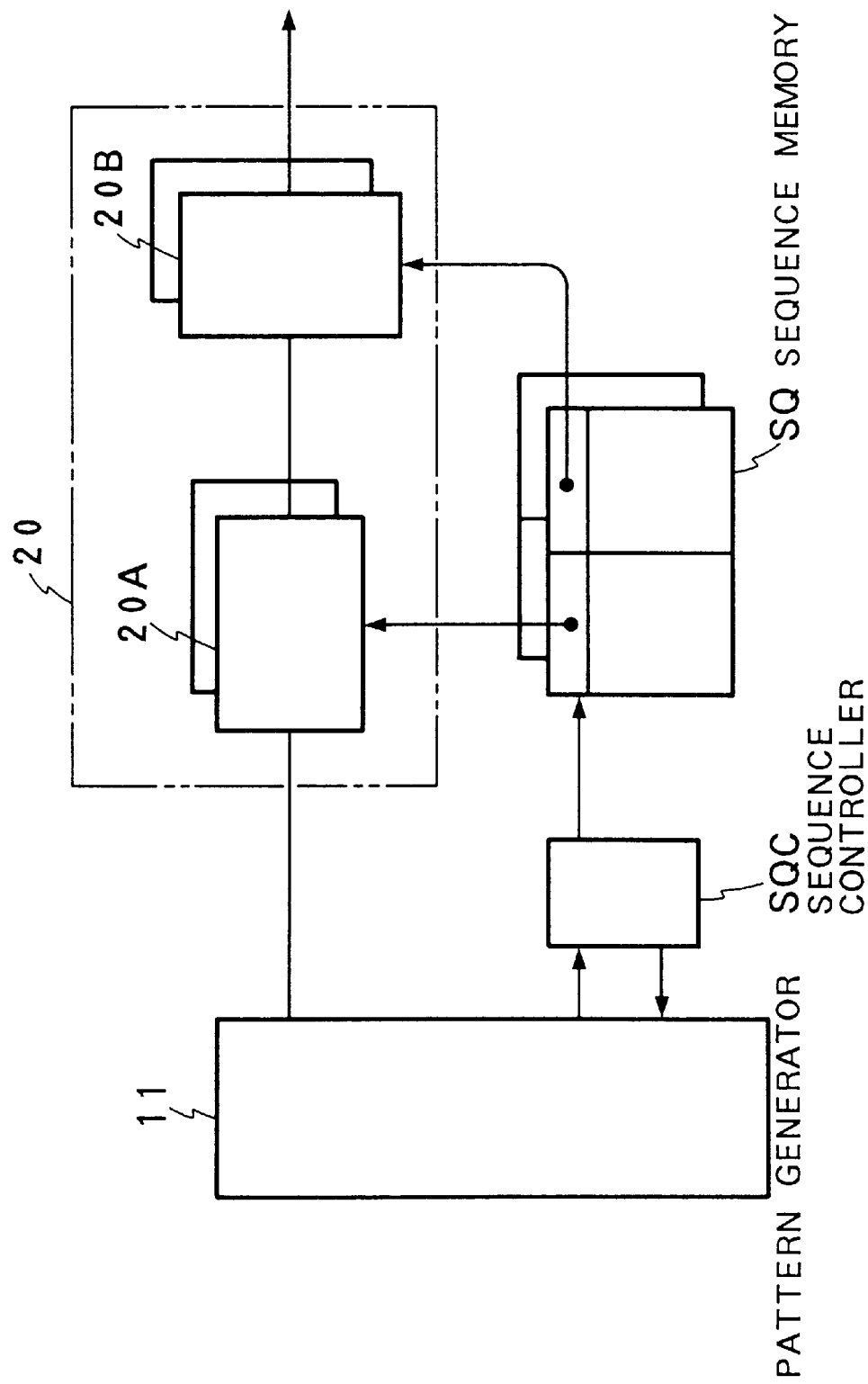
FIG. 13 is a block diagram showing a specific embodiment of the pattern converting means in case of practically using the function converting block shown in FIG. 8.
Figure 14:
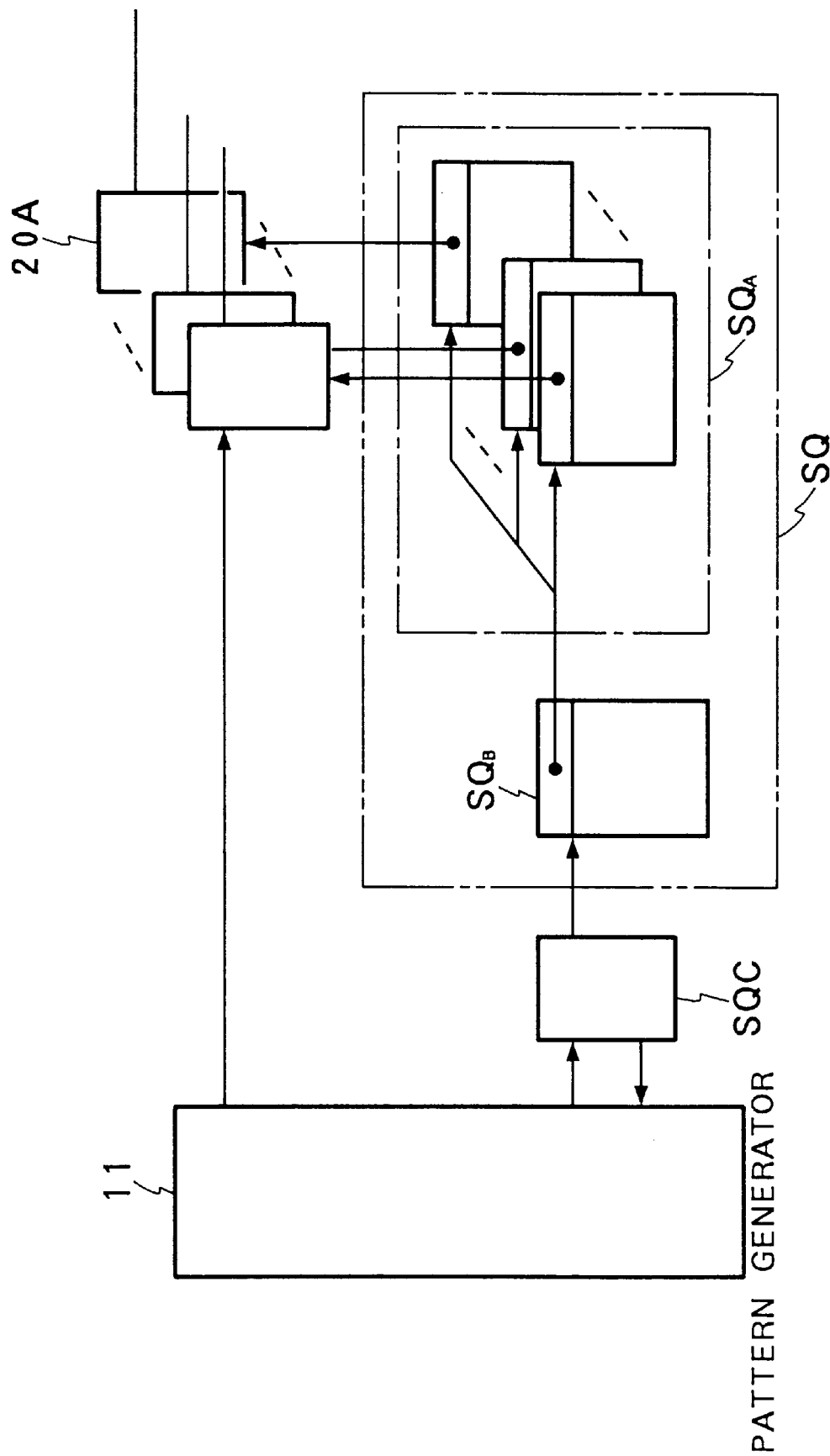
FIG. 14 is a block diagram showing another specific embodiment of the sequence memory used in the present invention, together with a specific embodiment of the function converting block.

FIG. 13 illustrates a specific embodiment of the pattern converting means 20 in the case of actually using the function converting block 20A shown in FIG. 8. In this example, the sequence memory SQ is shown to be used in common to both of the function converting blocks 20A and 20B.

FIG. 17 illustrates another example of the construction of the sequence memory SQ. In this example, the sequence memory SQ is shown to be divided into a sequence memory part $SQ_A$ for storing a control signal for controlling the function converting block 20A and a sequence memory part $SQ_B$ for applying an address signal to the sequence memory part $SQ_A$. With such an indirect memory reading configuration wherein the control signal for defining the operation of the function converting block 20A is stored in the sequence memory $SQ_A$ and is read out therefrom using the address signal stored in the sequence memory part $SQ_B$, it is possible to reduce the memory capacity needed as a whole.

While the embodiment of FIG. 1 has been described to have the function converting block 20A provided at the preceding stage and the function converting block 20B at the subsequent stage, it will readily be understood that they can be cascade-connected in the reverse order. It is also possible to add to the FIG. 1 embodiment the function converting blocks shown in FIGS. 8 and 12 and to selectively use them.

As described above, according to the present invention, even if an additional circuit is connected to either of the input and output sides of the functional block to be tested, pattern data is converted in pattern by the pattern converting means 20 into one having the relation reverse to the pattern conversion performed by the additional circuit and the thus converted pattern data is provided to the circuit under test. As a result, the pattern data having a predetermined original pattern can be fed to the functional block provided in the circuit under test. Accordingly, the pattern data that is generated by the pattern generator may be pattern data of the original form for testing the functional block, and the pattern data can be generated regardless of the presence of the additional circuit. Consequently, even if an additional circuit connected to the same functional block differs for each case, the difference between the additional circuits can cope with by selective use of the function converting blocks provided in the pattern converting means 20, and the software for pattern generation need not be modified or changed. Thus, since the test pattern generating programs prepared separately for respective functional blocks can be used in common in case the additional circuits differ, the cost for developing the test pattern generating programs can be reduced.

What is claimed is:

1. A circuit testing apparatus for testing a circuit device under test having at least a functional block therein, said circuit device under test being arranged such that an additional circuit is connected to at least either of input and output sides of said functional block, said circuit testing apparatus comprising:

a pattern generator generating pattern data which is originally prepared for testing said functional block in disregard of presence of said additional circuit;

pattern converting means provided between said circuit device under test and said pattern generator for converting the pattern data outputted from said pattern generator into a converted pattern data having a pattern reverse to that converted by said additional circuit, a logical comparator; and means for inputting the converted pattern data to said circuit device under test and for outputting an output signal from said circuit device to said logical comparator;

said logical comparator operatively comparing the output signal from said circuit device under test with the converted pattern data to determine difference therebetween, whereby said functional block can be tested using the originally prepared pattern data regardless of the presence of said additional circuit.

2. The circuit testing apparatus according to claim 1, wherein said additional circuit is a retiming circuit having a pattern converting function which serves to delay in time test pattern data applied to said functional block of said circuit under test, and said pattern converting means possesses a pattern converting function which serves to delay expected value pattern data by the same delay time as that given by said retiming circuit.

3. The circuit testing apparatus according to claim 1, wherein said additional circuit is a serial-to-parallel converter circuit having a pattern converting function which serves to convert a serial signal into parallel signals and to input said parallel signals into said functional block of said circuit under test, and said pattern converting means has a parallel-to-serial converting function which serves to convert pattern data into a serial signal.

4. The circuit testing apparatus according to claim 1, wherein said additional circuit comprises a selector for dividing signals of different properties applied to a common input pin of said functional block of said circuit under test, and buffers having different delay stage in number from each other and provided for applying said signals of different properties divided by said selector to said functional block at the same timing, and said pattern converting means is formed by a variable delay circuit which performs a pattern conversion for enabling to reverse the sequence of said signals of different properties serially applied thereto.

5. The circuit testing apparatus according to claim 1, wherein said additional circuit has a function which serves to arithmetically process a signal applied thereto and to apply said processed signal to said functional block of said circuit under test, and said pattern converting circuit is formed by computing means which performs an arithmetical processing reverse to that performed by said additional circuit.

6. A circuit testing apparatus for testing at least a functional block included in a circuit device under test, said functional block is associated with at least an additional circuit at least either input or output side thereof, said testing apparatus comprising:

- a pattern generator generating pattern data which is originally prepared for testing said functional block in disregard of presence of said additional circuit and includes test pattern data and expected value pattern data;
- pattern converting means including at least a function converting block for converting said pattern data outputted from said pattern generator into a converted pattern data which has a reverse pattern conversion with respect to pattern conversion performed by said additional circuit and which includes a converted test pattern data and a converted expected value pattern data;
- a waveform generator generating a test pattern signal based on the converted test pattern data and for supplying said test pattern signal to said circuit device under test; and
- a logical comparator comparing a response output signal from said circuit device with said converted expected value pattern data from said pattern converting means to thereby detect anti-coincidence between them.

7. The circuit testing apparatus according to claim 6, wherein said comparator is associated with means for converting the output signal of said circuit device under test into a digital signal which is then supplied to said logical comparator so as to be compared with the converted expected pattern data.

8. The circuit testing apparatus according to claim 6, which can be used for testing different circuit devices including different additional circuits associated a functional block to be tested, respectively, wherein said pattern generator generates pattern data originally prepared for testing said functional block to one of the circuit devices under test in disregard of presence of said additional circuits, wherein said pattern converting means includes:

- a plurality of function converting blocks each prepared to correspond to each additional circuit for performing a pattern conversion inverse to that performed by the corresponding additional circuit; and
- selector means for selecting one of said function converting blocks in accordance with the additional circuit used in the circuit device to be tested, whereby said functional block can be tested by using said originally prepared pattern data regardless of presence of said additional circuit.

* * * * *